United States Patent
Kocian et al.

(10) Patent No.: US 7,226,810 B2
(45) Date of Patent: Jun. 5, 2007

(54) MEMS DEVICE WAFER-LEVEL PACKAGE

(75) Inventors: Thomas A. Kocian, Dallas, TX (US); Richard L. Knipe, McKinney, TX (US); Mark H. Strumpell, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/157,024

(22) Filed: Jun. 20, 2005

(65) Prior Publication Data

US 2005/0233498 A1    Oct. 20, 2005

Related U.S. Application Data

(62) Division of application No. 10/135,559, filed on Apr. 29, 2002, now Pat. No. 6,908,791.

(51) Int. Cl.
*H01L 21/50* (2006.01)
*H01L 21/46* (2006.01)

(52) U.S. Cl. .................. 438/110; 438/113; 438/460; 257/E21.499

(58) Field of Classification Search .............. 438/14, 438/15, 17, 106, 107, 110, 112, 113, 116, 438/118, 455, 456
See application file for complete search history.

(56) References Cited

U.S. PATENT DOCUMENTS

| | | |
|---|---|---|
| 5,083,857 A | 1/1992 | Hornbeck |
| 5,435,876 A | 7/1995 | Alfaro et al. |
| 5,492,596 A | 2/1996 | Cho |
| 5,716,759 A | 2/1998 | Badehi |
| 5,798,557 A | 8/1998 | Salatino et al. |
| 5,915,168 A | 6/1999 | Salatino et al. |
| 5,980,663 A | 11/1999 | Badehi |
| 6,022,758 A | 2/2000 | Badehi |
| 6,040,235 A | 3/2000 | Badehi |
| 6,063,696 A | 5/2000 | Brenner et al. |
| 6,117,705 A | 9/2000 | Glenn et al. |
| 6,117,707 A | 9/2000 | Badehi |
| 6,181,460 B1 * | 1/2001 | Tran et al. ................ 359/291 |
| 6,228,684 B1 | 5/2001 | Maruyama |
| 6,285,064 B1 | 9/2001 | Foster |
| 6,368,930 B1 | 4/2002 | Enquist |
| 6,428,650 B1 | 8/2002 | Chung |
| 6,500,694 B1 | 12/2002 | Enquist |
| 6,531,328 B1 | 3/2003 | Chen |
| 6,563,133 B1 | 5/2003 | Tong |
| 6,613,607 B2 | 9/2003 | Janssen et al. |
| 6,624,505 B2 | 9/2003 | Badehi |
| 6,627,531 B2 | 9/2003 | Enquist |
| 6,646,289 B1 | 11/2003 | Badehi |
| 6,660,562 B2 | 12/2003 | Lee |
| 6,759,723 B2 | 7/2004 | Silverbrook |
| 6,768,628 B2 | 7/2004 | Harris et al. |

(Continued)

*Primary Examiner*—Scott B. Geyer
(74) *Attorney, Agent, or Firm*—Charles A. Brill; Wade James Brady, III; Frederick J. Telecky, Jr.

(57) ABSTRACT

A method and system in which a semiconductor wafer having a plurality of dies is inspected through a visual inspection and/or an electrical test. If certain of the dies on the wafer pass the inspection, then windows are mounted or affixed above those certain dies while they are still a part of the wafer.

9 Claims, 3 Drawing Sheets

U.S. PATENT DOCUMENTS

| | | |
|---|---|---|
| 6,777,767 B2 | 8/2004 | Badehi |
| 6,906,847 B2 | 6/2005 | Huibers et al. |
| 6,908,791 B2 * | 6/2005 | Kocian et al. ............. 438/110 |
| 6,947,200 B2 | 9/2005 | Huibers |
| 6,969,635 B2 | 11/2005 | Patel et al. |
| 6,975,444 B2 | 12/2005 | Huibers |
| 6,995,040 B2 | 2/2006 | Patel et al. |
| 7,023,607 B2 | 4/2006 | Huibers |
| 7,027,207 B2 | 4/2006 | Huibers |

* cited by examiner

MEMS DEVICE WAFER-LEVEL PACKAGE

This application is a Divisional of application Ser. No. 10/135,559, filed 29 Apr. 2002 now U.S. Pat. No. 6,908,791.

TECHNICAL FIELD

The embodiments described in this application are for application in the area of semiconductor device packaging, and in specific embodiments Micro-Electro-Mechanical Systems ("MEMS").

BACKGROUND

Typically, a semiconductor wafer is patterned and processed to create a plurality of integrated circuits. The individual dies are separated from one another by scribe lines that encompass each die and are formed during the patterning process. At the end of the wafer-level processing, each die includes a complete set of circuitry, and typically includes a set of test pads and/or bond pads that a bed-of-nails semiconductor test set-up can use to electrically communicate with the circuitry of each die. In this way, it is possible to perform wafer-level electrical test of the circuitry to eliminate from further processing at least some of the die failures before packaging the individual dies.

The conventional wafer is then shipped, to a "back end" manufacturing facility, whereupon the wafer is sawed or cut along the scribe lines to produce singulated dies. The singulated dies, or "chips," are then mounted in lead frames and connected to the leads of the lead frame by bond wires. Finally, the assemblies are encapsulated in packages, typically within plastic or ceramic chip packages to form a packaged semiconductor.

In conventional semiconductor processing, a fully processed semiconductor wafer is coated with a protective layer of oxide prior to the wafer being sawed into individual dies. Thus, each individual die is protected from damage that may otherwise be caused by the debris particles generated during the sawing. The scribe lines also serve to seal each integrated circuit from the next so that there is no ion contamination of each circuit form the wafer saw break. The scribe lines are also used to provide alignment of reticles used during the repeated integrated circuit patterning process.

Electromechanical devices, including MEMS devices and in specific embodiments, optical devices such as Digital Micromirror Devices ("DMDs"), however, generally are not protected with an oxide layer at the wafer level, and in such instances will not be similarly protected from sawing debris and other contamination. The individual mirrors of the DMD mirror array are susceptible to damage from debris, including particles generated during the wafer saw-and-break or full-saw process. Because the DMD is a micromechanical device with movable pixel mirrors, the DMDs fabricated upon a wafer may not be conveniently covered with a protective oxide coating prior to a saw process as is conventional for to other semiconductor processing techniques. Moreover, due to the conductive address electrodes which are positioned below the conductive mirrors, a conductive particle entrapped between the mirror and address electrode could short the micromirror to the address electrode.

Certain techniques for minimizing particulate damage to DMD mirrors or other MEMS structures were disclosed in commonly assigned U.S. Pat. No. 5,435,876 entitled Grid Array Masking Tape Process. Technique disclosed therein included using a grid array masking tape over the active surface of the processed wafer. The tape would adhere to the wafer along a grid extending between the formed integrated circuits to prevent debris from damaging the active surface of the devices during the sawing process. The tape was removed after the saw process and then a photoresist, which had also remained under the mirror layer during the sawing was removed by a plasma etch.

Another prior-art method of dealing with contamination issues includes the application of temporary resist layers over the MEMS-type structures or DMD micromirrors to protect them from damage from debris or other environmental factors. Examples of this approach are described in commonly assigned U.S. Pat. Nos. 5,083,857 and 6,063,696. Another method is to cover the all the dies on a wafer with a lid wafer or with another cover. Examples of this approach are described in U.S. Pat. Nos. 5,498,557 and 5,915,168.

SUMMARY

One difficulty with the approaches described above is that it can be difficult to test the operation of the devices at the wafer-level processing area. Electrical tests may also be limited by the fact that at the wafer-level the MEMS-type structures or DMD micromirrors cannot be operated in their intended environments, as they are either exposed to the environment, not properly surrounded by lubricant, captured by a deposited protective layer, or the entire wafer is covered such that the test pads cannot be reached using the bed-of-nails wafer test assembly.

Without being able to individually test the dies, the manufacturer passes the wafer onto the assembly area, also known as a "back end," where the wafers are separated into individual dies, which are then mounted in packages and tested. Even if the dies have been protected by a wafer-level-applied window or other mechanism prior to sawing, it was thus necessary to assembly many devices which, due to wafer-level defects, would not have had to be assembled. These extraneous steps drive up the manufacturing costs, both from a piece-part cost standpoint, as well as from a labor cost standpoint.

DESCRIPTION OF THE EMBODIMENTS

Figure 1:
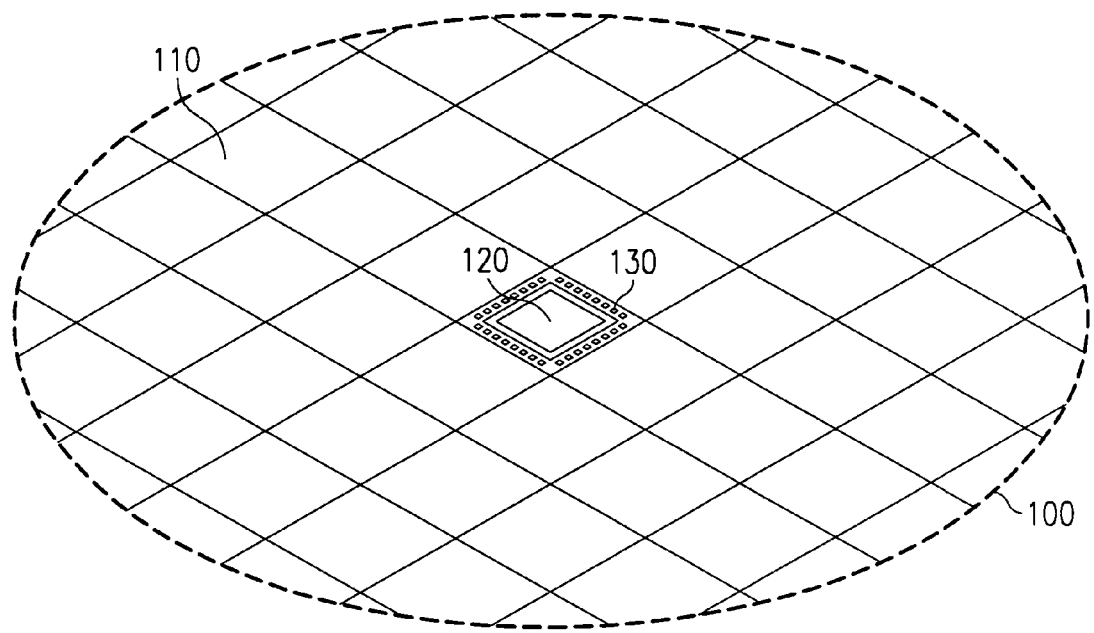
FIG. 1 is a perspective view of a wafer having a number of dies formed on it.

FIG. 1 shows a perspective view of a wafer 100 having individual dies 110. The number of dies 110 on a given wafer 100 varies depending upon the size of the individual dies 110 and upon the size of the wafer 100. Within each die in the embodiments described in this application, there is a DMD or other MEMS device 120. Although a MEMS device 120 may be used as the exemplary semiconductor device in the embodiments described below, the device 120 may also be a DMD or other semiconductor device where it is desirable to be able to individually protect and test the device at the wafer level.

The MEMS device 120 is surrounded by bond pads 130. As is typical with wafer-level processing, multiple devices on the separate dies are formed simultaneously as the wafer 100 passes through the wafer-level processing, in which circuit patterns are formed on the multiple devices through exposing and patterning circuit layers by photolithography. Not only can multiple devices be formed at the wafer level, but they can be inspected and electrically tested at that level as well.

Figure 2:
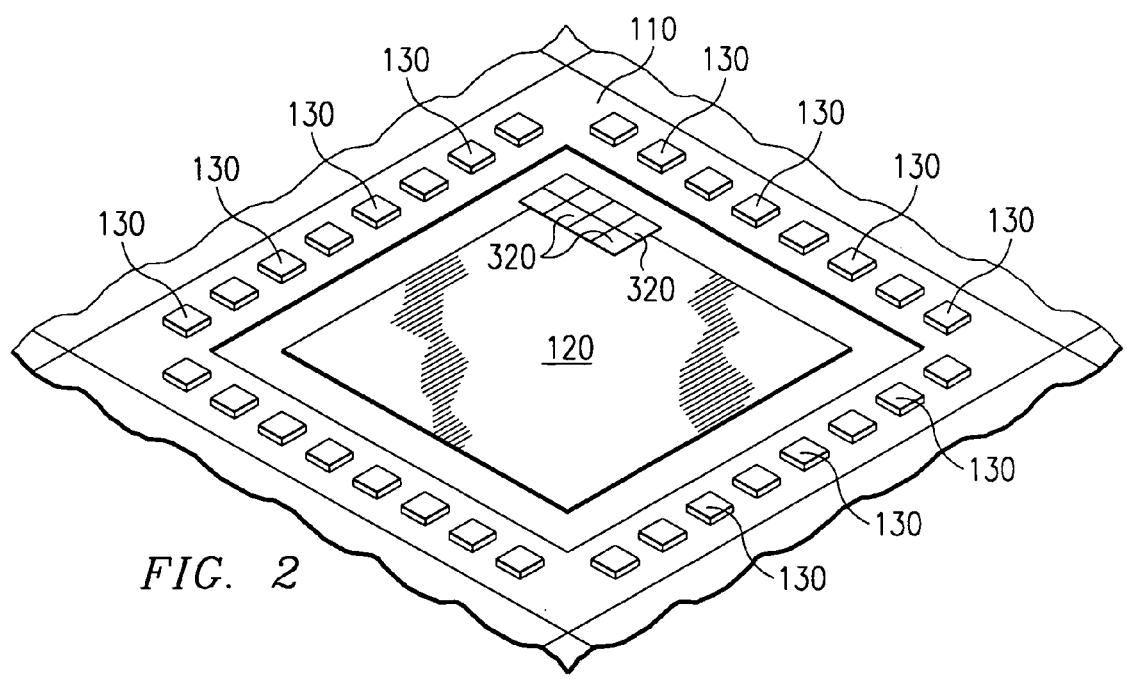
FIG. 2 is an embedded view of a die on a wafer, such as the wafer of FIG. 1.

FIG. 2 shows an embedded view of a die 110 such as the one shown in FIG. 1. The die 110 has the MEMS device 120 formed on it, with bond pads 130 at the perimeter of the die 110 and surrounding the device 120 in this embodiment. According to the methods described in this application, the devices 120 may be preliminarily tested at this stage, before any window or covering (not shown, see FIG. 4) is applied over them.

With a preliminary electrical test using the exposed bond pads and a bed-of-nails wafer test fixture, it can be preliminarily determined if there are wafer-level part failures. The automatic equipment used in the manufacturing thus engages with the circuitry through test pads, which could at this stage be in the interior portion of the device, or bond pads 130, which are generally arranged about the perimeter of the die 110.

Still referring to FIG. 2, at the wafer level shown here, the limited testing that occurs at this stage allows the manufacturing process to determine whether some devices have failed at the wafer level stage or are defective at the wafer level stage. By testing at this stage, it is possible to avoid the expense of attaching a window or other cover to all of the devices to be manufactured and to only place the window on the devices that are preliminarily determined to be operable.

More complete electrical and operational testing of MEMS devices generally follows the sealing of the devices with covers, which may form chambers (not shown, see FIG. 4) surrounding the electromechanical components. The chambers may be evacuated, or may contain a lubricants and/or viscous materials to help control the motion of the electromechanical components.

Accordingly, in order to maximize the testing that can occur at the wafer-processing stage, thereby minimizing the efficiency of such testing through decreased handling costs and increased automation, it is advantageous to cover and test the devices while still at the wafer-processing stage. Processes and structures for covering and testing devices at the wafer level are described in greater detail below.

Figure 3:
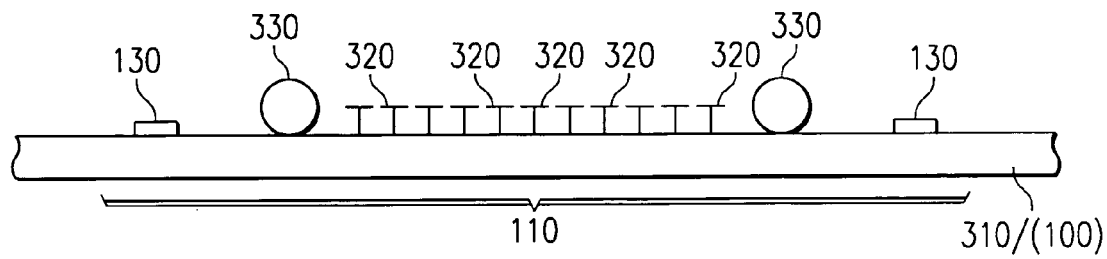
FIG. 3 is a cross-sectional view through one of the die on a wafer.

FIG. 3 is a cross-sectional view of the die 110 shown in FIG. 2. Shown in FIG. 3 is a silicon substrate 310 and bond pads 130, as well as individual micromirrors or other MEMS structures 320, which in this embodiment may form an exemplary DMD or MEMS device 120. Also shown in FIG. 3 is a bead of adhesive 330, which has been formed around the MEMS structures 320 and upon which the window (not shown, see FIG. 4) will be mounted. The bead of adhesive 330 is placed in this embodiment about the entire perimeter of the device 320, whereby when the window is mounted upon the adhesive, a cavity is formed between the window 410 (not shown, see FIG. 4) and the device substrate 310, bounded by the adhesive perimeter 330. The adhesive 330 may be, for example, a hermetic solder or a non-hermetic adhesive. The solder or adhesive may be patterned on the wafer, or may be applied through other means, including non-photolithographic means. Using the adhesive 330, the cavity 420 (see FIG. 4) can be made hermetic, air-tight, or partially open to passage of fluids or gases in or out of the cavity.

Other methods could also be used to form a hermetically sealed cavity or a non-hermetically sealed cavity and still achieve a desirable manufacturing process. For example, solder bonding could be used to affix a window 410 to the substrate 310, or a mechanical fixture could be micromachined onto the device substrate 310 for capturing the window 410 (see FIG. 4). In another embodiment, a metallic seal ring may be mounted to the substrate such that the MEMS devices 320 are surrounded. The scope of what is claimed below should not be limited by the specific examples of the processes and structures that are disclosed in this specification.

Figure 4:
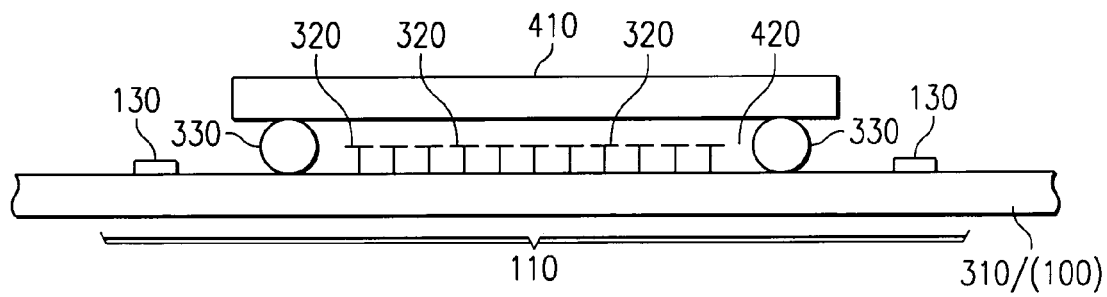
FIG. 4 is a cross-sectional view of the portion of the die shown in FIG. 3, after the attachment of a window above the die.

FIG. 4 shows a cross-sectional view of approximately the same area of the wafer after the window 410 has been placed onto the adhesive 330. According to one embodiment, the adhesive 330, the substrate 310, and the window 410 enclose a cavity 420 between the window 410 and the substrate 310. This approach allows the MEMS structures 320 to be secured and protected while still at the wafer fabrication stage, and further allows the cavities to be evacuated or filled with lubricants and/or viscous substances to control the movement of the MEMS structures 320 and/or protect those structures. Specifically, and as a further example, wafer fabrication processes often include the use of gases and evacuated chambers, and thus may be employed for sealing the cavities 420 in evacuated environments or in environments in which a surrounding gas envelopes the MEMS structures 320 in the cavity 420.

Although the approach of selectively mounting windows above the devices of a wafer has been described here primarily in the context of applying transparent windows above micromirror structures, the teachings of this application also relate to applying translucent or opaque coverings over any semiconductor or other structures. The scope of what is protected by any patent that ultimately issues from this application is not to be limited to any specific embodiments described in the specification, but is to be determined based on the claims themselves.

Once the window 410 has been applied to the selected devices, full wafer-level electrical testing can occur as in normal semiconductor processes. For example, the wafers can be transported from the "wafer fab" to an assembly area, which would typically have reduced air purity requirements, such as a standard assembly and test class (e.g., "10k") cleanroom. Also at this stage, there may be an array of fully functioning DMDs or other MEMS devices 120 on the wafer 310, which can be operationally tested with the proper equipment. For example, it is possible at this stage to project images from the DMDs or other MEMS devices 120 while they are still a part of the wafer 310, thereby conducting operational testing of the devices 120 before separating them from the wafer 310.

Besides wafer-level and operational testing, it is also possible in this embodiment to conduct numerous other tests such as burn-in, stress, and accelerated life testing, all while still at the wafer level. To the extent that the "bad" parts that can be identified at the wafer level by this available battery of tests, those bad parts will not have to be further packaged and tested, thus saving money in the overall manufacturing process.

Figure 5:
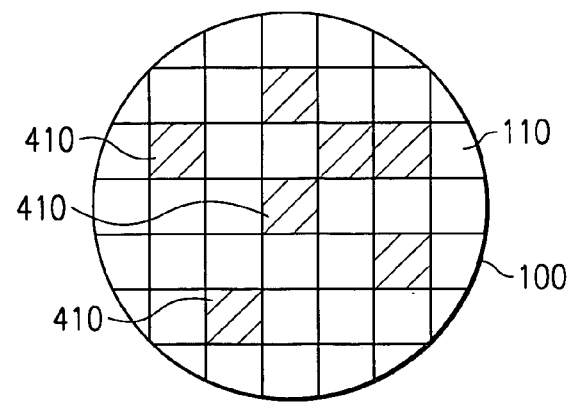
FIG. 5 is a top view of a wafer having windows mounted to selected dies.

FIG. 5 is an exemplary wafer 100, where windows 410 have been mounted to a subset of the dies 110 while still at the wafer level. As illustrated in FIG. 5, by employing preliminary testing practices to the devices 120 on the wafer 100, it is possible to identify component failures before incurring the expense of mounting windows on all the dies 110 and of conducting wafer-level testing of all those dies. Working on a reduced subset of devices 120 can significantly reduce the expenses that would otherwise have been incurred in the processing of the wafer 110. After the windows have been mounted to those devices that did not fail preliminary tests, it is possible to process the wafer much as a normal semiconductor wafer would be processed.

Figure 6:
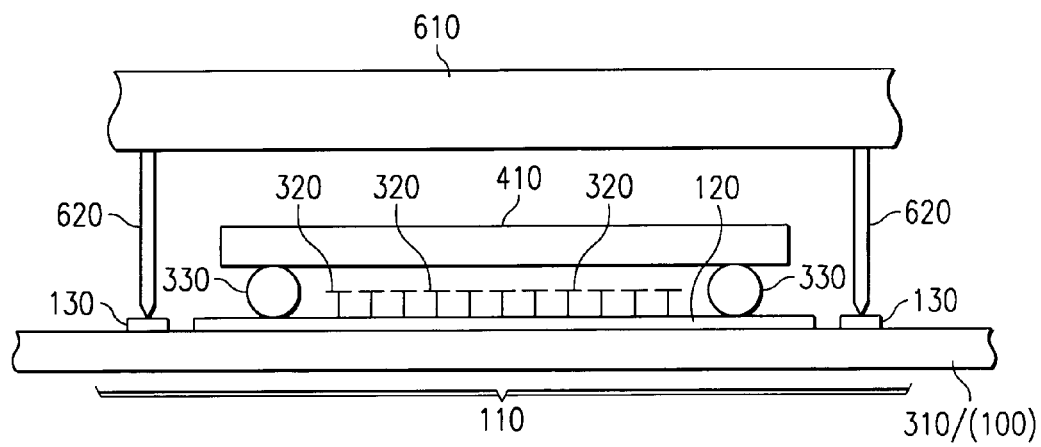
FIG. 6 is a cross-sectional view of the portion of the die shown in FIG. 4 with a bed-of-nails test head in engagement with it.

FIG. 6 depicts a cross-sectional view of the wafer 100 including a single die 110 on the wafer 100. A portion of a bed-of-nails wafer test head 610 is shown above the die 110. The wafer tester 610 has pins 620, which are spring-loaded to engage with contacts or test pads on the die 110. The tester 610 may engage with a single die or with a plurality of dies at once, whereby one or many devices can be tested at a given time. Not only can the tester 610 be made to test for connectivity, resistivity, and other passive aspects of the devices, but it can also energize and control the device through control signals applied to test pads (not shown) or contacts 130. Through these control signals, the devices 120 can be operated as they are intended, and electrical parameters can be measured along with visual inspection of the actions of the MEMS structures 320 or other observable performance metrics.

By placing individual windows 410 on the selected dies 110 at this stage, it is possible both to have protected MEMS structures 320 while still providing access by the bed-of-nails tester 610 to the individual dies 110. The devices 120 on the dies 110 can thus be tested outside the high-level wafer fabrication clean-room environment (such as class 10–100 cleanrooms) because the released MEMS structures are protected by the attached windows 410.

Figure 7:
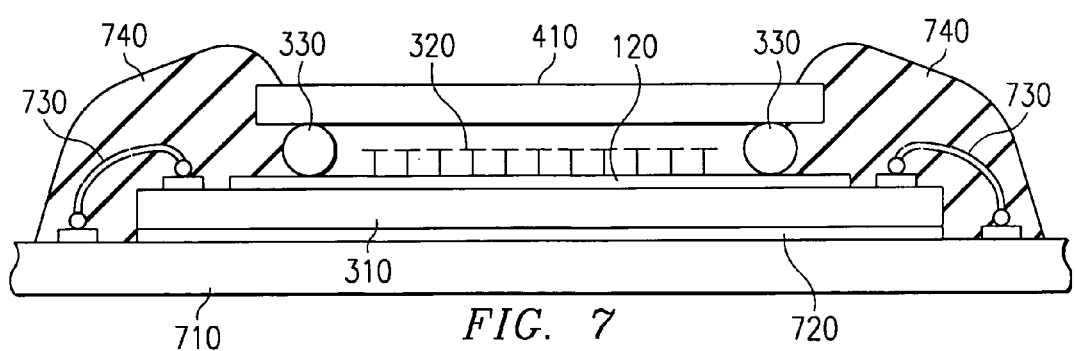
FIG. 7 is a cross-section view of a singulated die mounted and electrically connected to a circuit board.

As shown in FIG. 7, it is then possible to singulate the individual dies 110 from the wafer 100. The dies can then be mounted on low-cost paper or fiberglass boards (e.g., "PWB-type" circuit boards) 710 for further testing or ultimate assembly, rather than mounting them to expensive ceramic substrates, although in other embodiments, ceramic substrates can still be used advantageously. To avoid Coefficient of Thermal Expansion ("CTE") mismatches between the silicon substrate 310 and an underlying PWB-type board, a matching underfill 720 may be required, which will allow relative movement between the materials during heating and cooling of the materials. The wirebond interconnects 730 from the singulated die to the PWB can be covered with a "dark" potting material 740, thereby eliminating the requirement of an aperture to cover the undesirable wirebond light reflections. For system-level designs, a secondary package or cover glass (not shown) could also be implemented to cover the device to protect it and to minimize dust particles reaching the device such as, for example, in a projector system.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention. Windows may be transparent, translucent, or opaque, and may be formed of glass, ceramics, plastics, silicon, or other materials. The wafer may be formed of silicon or gallium arsenide or other semiconductor materials which are common now or which may become commonly used in the future. The devices protected by the windows mounted to the wafers as described above may be MEMS devices or other electromechanical devices such as micromirrors or microscopic gears, levers or other movable microscopic elements, or they may be purely electronic devices, acousto-optic devices, electro-optic devices, or other types of devices that are manufactured in wafer form and can be advantageously individually protected by windows over enclosed areas. Such devices may be common as of the time of the filing of this application, or they may be later developed; in either instance, if they can be advantageously protected in individual chambers at the wafer level, the approaches described and claimed in this application would apply to such devices.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of manufacturing a semiconductor device comprising:
   a) providing a semiconductor wafer;
   b) forming a plurality of dies on the semiconductor wafer;
   c) performing an inspection of the plurality of dies;
   d) attaching windows to dies that pass the inspection and not attaching windows that do not pass the inspection, while the dies are still part of the wafer; and
   e) cutting the semiconductor wafer into individual devices.

2. The method of claim 1 wherein the inspection is an electrical test.

3. The method of claim 1 wherein the inspection is a visual inspection.

4. The method of claim 1 wherein at least one die comprises an optical device.

5. The method of claim 4 wherein the optical device is a digital micromirror device.

6. The method of claim 1 and further comprising the step of performing one or more additional inspections after the attaching step and prior to said cutting step.

7. The method of claim 6 wherein at least one of the additional inspections includes operational testing.

8. The method of claim 7 wherein the operational testing includes projecting an image from at least one of the dies.

9. The method of claim 6 where at least some of the inspections are performed outside of the wafer fabrication area.

* * * * *